(12) United States Patent
Umeno et al.

(10) Patent No.: US 7,344,689 B2
(45) Date of Patent: Mar. 18, 2008

(54) SILICON WAFER FOR IGBT AND METHOD FOR PRODUCING SAME

(75) Inventors: Shigeru Umeno, Tokyo (JP); Yasuhiro Oura, Tokyo (JP); Koji Kato, Tokyo (JP)

(73) Assignee: Sumco Corporation, Tokyo (JP)

( * ) Notice: Subject to any disclaimer, the term of this patent is extended or adjusted under 35 U.S.C. 154(b) by 57 days.

(21) Appl. No.: 11/449,498

(22) Filed: Jun. 7, 2006

(65) Prior Publication Data
US 2007/0000427 A1    Jan. 4, 2007

(30) Foreign Application Priority Data
Jun. 9, 2005    (JP) .............................. 2005-169929

(51) Int. Cl.
*C01B 33/26* (2006.01)
*C30B 15/20* (2006.01)
(52) U.S. Cl. .................. 423/328.2; 117/13; 117/19; 117/20
(58) Field of Classification Search ............... 117/13, 117/19, 20; 423/328.2
See application file for complete search history.

(56) References Cited

FOREIGN PATENT DOCUMENTS

| EP | 1513193 A1 | | 3/2005 |
|---|---|---|---|
| JP | 2002128591 | * | 5/2002 |
| JP | WO2004/073057 A1 | | 8/2004 |
| JP | 2006344823 | * | 12/2006 |

OTHER PUBLICATIONS

Takasu, S. et al. Neutron Transmuted Magnetic Czocharski Grown Silicon Wafer For Power Device, PESC '88 Record, 19th Annual IEEE Power Electronics Specialists Conference (Cat. No. 88CH2523-9), IEEE New York, New York, USA, Apr. 1988, pp. 1339-1345.*

* cited by examiner

*Primary Examiner*—Felisa Hiteshew
(74) *Attorney, Agent, or Firm*—Kolisch Hartwell, P.C.

(57) ABSTRACT

A silicon wafer for an IGBT is produced by forming an ingot having an interstitial oxygen concentration [Oi] of not more than $7.0 \times 10^{17}$ atoms/cm$^3$ by the Czochralski method; doping phosphorus in the ingot by neutron beam irradiation to the ingot; slicing a wafer from the ingot; performing annealing of the wafer in an oxidizing atmosphere containing at least oxygen at a temperature satisfying a predetermined formula; and forming a polysilicon layer or a strained layer on one side of the wafer.

2 Claims, 7 Drawing Sheets

FIG. 2
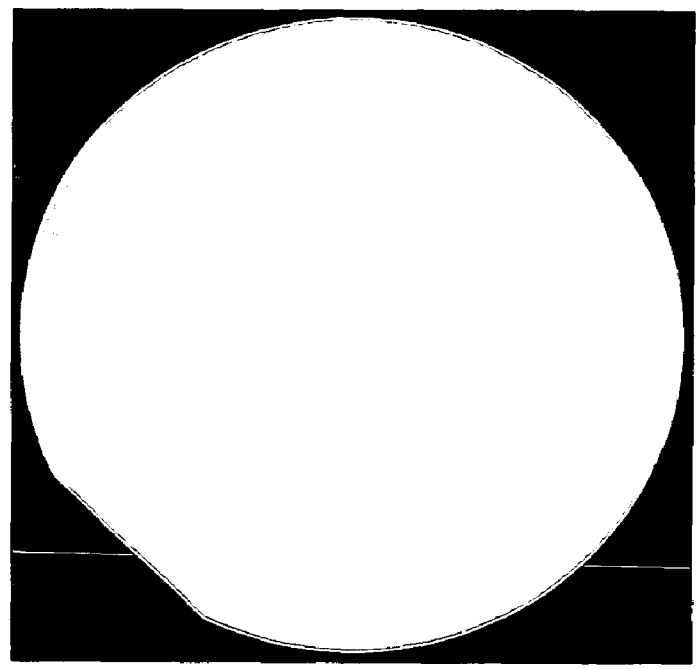
FIG. 2B
WAFER 2
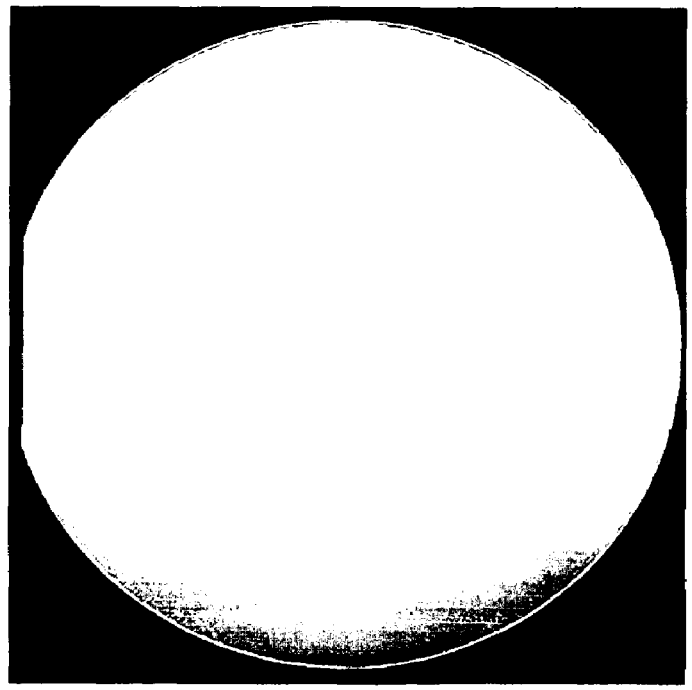
FIG. 2A
WAFER 1

FIG. 3
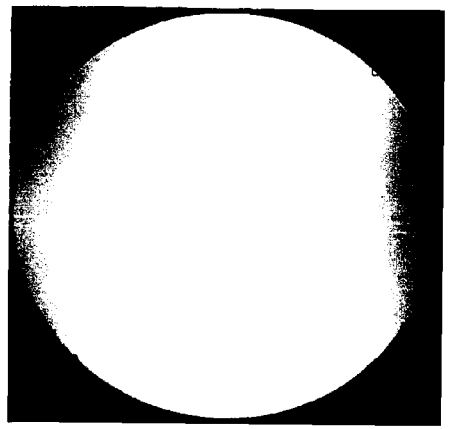
FIG. 3B
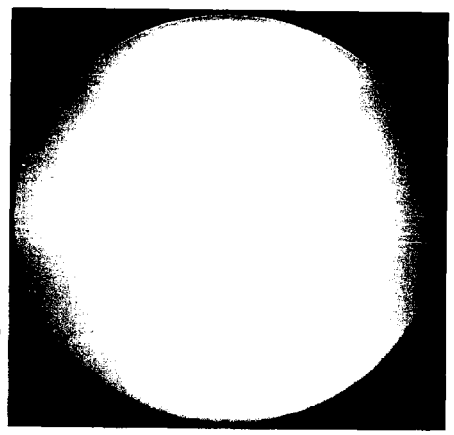
FIG. 3D
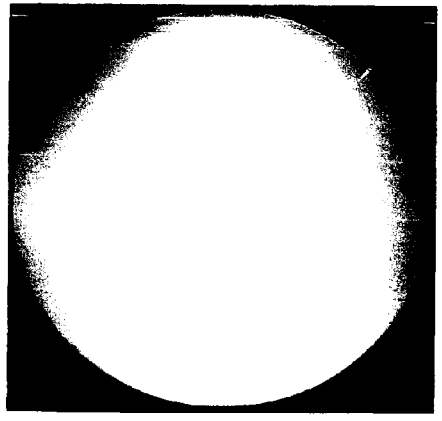
FIG. 3A
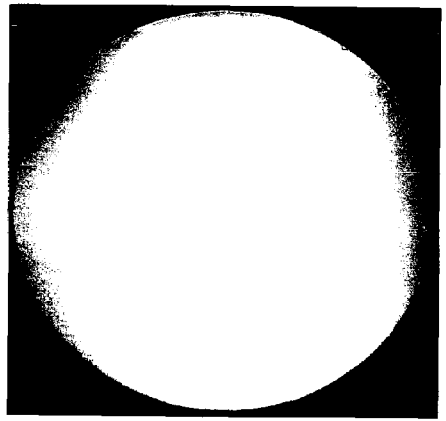
FIG. 3C
EXAMPLE 3
NOT DOPED WITH NITROGEN
EXAMPLE 2
DOPED WITH NITROGEN

BEFORE HEAT TREATMENT
MAPPING MEASUREMENT (1/e LIFETIME)

2242 μsec (1362 ~ 3021)

AFTER HEAT TREATMENT
MAPPING MEASUREMENT (1/e LIFETIME)

1869 μsec (271 ~ 2688)

BEFORE HEAT TREATMENT

2186 μsec (1792~2980)

AFTER HEAT TREATMENT

1832 μsec (1265~2463)

POINTS OF MEASUREMENTS

POINTS OF MEASUREMENTS

SILICON WAFER FOR IGBT AND METHOD FOR PRODUCING SAME

BACKGROUND OF THE INVENTION

1. Field of the Invention

The present invention relates to a silicon wafer which is suitably used as a substrate for an insulated gate bipolar transistor (IGBT) and a method for producing the same. Specifically, the present invention relates to a silicon wafer for IGBT, which is produced through a Czochralski method (CZ method).

Priority is claimed on Japanese Patent Application No. 2005-169929, filed on Jun. 9, 2005, the content of which is incorporated herein by reference.

2. Description of Related Art

An insulated gate bipolar transistor (IGBT) comprises a MOSFET (Metal Oxide Semiconductor Field Effect Transistor) provided with a PN junction for hole injection. In the IGBT, a gate and an emitter are formed on a surface of an n⁻ type silicon layer having high resistitvity, and a collector is formed on the backside of the n⁻ type silicon layer via a PN junction. An IGBT is an element in which an electric current between the emitter and the collector is controlled by an electric voltage applied to gates intervening a silicon oxide film. In an IGBT, it is possible to reduce the on resistance by injection of hole from the collector to an n⁻ type silicon wafer positioned between the gate, emitter and collector. In addition, an IGBT is not easily destroyed even after a high electric current flows therethrough.

As described above, in the IGBT, an electric current is controlled by the gates intervening an oxide film. Therefore, it is desirable that the gate oxide film be free of defects. In addition, since the current flows between the emitter on the surface of the element and the collector on the back side of the element, defects formed on the wafer have a large influence on the property of the IGBT. Therefore, in the prior art, epitaxial wafers or silicon wafers obtained from a crystal formed by the FZ method (Floating-Zone Melting Method) have been used as a silicon layer for an IGBT.

However, in order to constitute an IGBT of high dielectric resistance, an n⁻ type silicon layer is required to have a thickness of about 100 μm. In order to realize such a thickness by epitaxial growth of the layer, a long production time is required, and therefore an increase in production cost cannot be avoided. When a crystal (FZ crystal) is produced by the FZ method, the amount of impurities contaminating the crystal during a production process of the crystal is smaller than that of a crystal (CZ crystal) produced by a CZ method. Therefore, it is possible to obtain a relatively defect-less silicon wafer by slicing the wafer (FZ wafer) from an FZ crystal, compared to the case in which a silicon wafer (CZ wafer) is sliced from a CZ crystal. On the other hand, it is difficult to produce a large crystal by the FZ method. Therefore, the FZ method is not appropriate for wafers having large diameter, or mass production of wafers.

On the other hand, silicon wafers sliced from a crystal produced by the CZ method include defects comprising microscopic voids of 0.1 to 0.3 μm in size. If such defects are exposed to a surface of a wafer, the defects form pits on the wafer surface. Those defects are generally called as COPs (Crystal Originated Particles). It has been impossible to use a silicon wafer having COPs as it is as a wafer for IGBT. Recently, as described in PCT international publication No. WO 2004/073057 (Patent Document 1), a method for producing a wafer has been developed, in which the numbers of COPs in the wafer have been reduced by performing a heat treatment of a wafer obtained through the CZ method.

Since a large sized crystal can be grown by the CZ method, the CZ method can easily provide a wafer having a large diameter. For example, mass production of wafers having a diameter of 300 mm has been realized. Therefore, a CZ wafer (a wafer sliced from a crystal grown by the CZ method) is suitable as a wafer for large scale integration circuit (LSI). However, CZ wafers have not been used as substrates for IGBT because of the following problems.

Firstly, there is a problem in terms of the yield of GOI (Gate Oxide Integrity). During the growth of a single crystal in the CZ method, excess vacancies occasionally condense to generate void defects of 0.2 to 0.3 μm in size. As described-above, those defects are called COPs. Surface pits formed by the exposure of COPs on the wafer surface or COPs in the vicinity of the wafer surface may be captured in the oxide film layer during a thermal oxidation process causing deterioration of GOI property. Therefore, in order to inhibit the influence on the GOI property, it is necessary to eliminate COPs.

Secondly, there is a problem in terms of fluctuation of resistivity. A silicon single crystal grown by the CZ method (CZ silicon) includes excess oxygen in the order of $1 \times 10^{18}$ atoms/cm³. Therefore, by a low temperature heat treatment at a temperature of about 450° C., oxygen donors are caused to occur and fluctuate the resistivity of a substrate. Therefore, it is important to inhibit the occurrence of oxygen donors.

Thirdly, there is a problem in terms of homogeneity in resistivity. Resistivity of a CZ silicon can be controlled by the amount of dopant added to the polycrystalline silicon. However, because of the small segregation coefficient of phosphorus (P), which is an element used in the substrate for an IGBT, concentration of phosphorus varies greatly in the lengthwise direction of a single crystal ingot. Therefore, wafers having a specific resistivity can be obtained only from a narrow portion of a single crystal ingot.

Fourthly, there is a problem in terms of deterioration of the recombination lifetime. As described above, a CZ silicon generally includes oxygen in an order of $1 \times 10^{18}$ atoms/cm³. Therefore, during a thermal process accompanied by a device formation process, excess oxygen precipitates to form SiO₂ deteriorating the recombination lifetime.

The technology disclosed in Patent Document 1 enables elimination of COPs, which are the factors deteriorating the GOI property. Therefore, the technology is applicable as a method for producing silicon wafers for IGBT. However, the technology described in Patent Document 1 has the following problem. Although the oxygen concentration can be controlled to a level allowing the elimination of COPs, the oxygen concentration may be sufficiently high to cause the above-described generation of oxygen donors, resulting in fluctuation of the resistivity or precipitation of excess oxygen resulting in the deterioration of the recombination lifetime. Especially, the deterioration of the recombination lifetime is highly undesirable in a silicon wafer for IGBT. Therefore, in order to use a silicon wafer as a silicon wafer for an IGBT, it is necessary to reliably inhibit the deterioration of the recombination lifetime, which may be caused by the oxide precipitation, as well as by contamination of heavy metals.

Based on the above-described consideration, an object of the invention is to provide a silicon wafer which is obtained from a silicon ingot grown by the CZ method and is suitably applicable for an IGBT, and a method for producing such a silicon wafer.

SUMMARY OF THE INVENTION

In the invention, the following constitution was adopted for achieving the above-described object.

A method for producing a silicon wafer for an IGBT of the invention comprises:

by the Czochralski method (CZ method), performing growth of a silicon ingot having an interstitial oxygen concentration [Oi] of not more than $7.0 \times 10^{17}$ atoms/cm$^3$;

performing doping of phosphorus in the silicon ingot by performing neutron beam irradiation to the ingot;

slicing a wafer from the ingot;

performing annealing of the wafer in an oxidizing atmosphere containing at least oxygen at a temperature of T(° C.) that satisfies a formula, $$[Oi] \leq 2.123 \times 10^{21} \exp(-1.035/k(T+273)) \quad (1); \text{ and}$$

forming a polysilicon layer or a strained layer on one side of the wafer, wherein [Oi] is measured by Fourier transform infrared spectroscopy based on a standard of ASTM F-121(1979); and k is Boltzman constant ($8.617 \times 10^{-5}$(eV/K)).

In the above-described method for producing a silicon wafer for an IGBT, it is preferable to form a silicon ingot having a nitrogen concentration of not less than $2 \times 10^{13}$ atoms/cm$^3$ and not more than $5 \times 10^{15}$ atoms/cm$^3$ by doping nitrogen during the growth of the silicon ingot.

Preferably, a phosphorus concentration in a silicon wafer produced by the above-described method may be not less than $4.3 \times 10^{13}$ atoms/cm$^3$ and not more than $2.2 \times 10^{14}$ atoms/cm$^3$, and a resistivity of the wafer may be about 20 Ω·cm to 100 Ω·cm.

In the above-described method for producing a silicon wafer for an IGBT, it is preferable to polish a surface of the wafer after the annealing of the wafer in the oxidizing atmosphere.

In the above-described method for producing a silicon wafer, by using a silicon ingot having a concentration of interstitial oxygen of not more than $7 \times 10^{17}$ atoms/cm$^3$, it is possible to provide an excellent silicon wafer in which a reduction of the recombination lifetime caused by the formation of oxide precipitates (bulk micro defects: BMDs) during the production process of an IGBT, and fluctuation of resistivity caused by the formation of oxygen donor are inhibited.

In addition, by irradiating neutrons to the silicon ingot, it is possible to transform a predetermined amount of the silicon atoms into phosphorus atoms, thereby realizing a homogeneous doping of phosphorus in the silicon ingot from which wafers having a constant resistivity can be obtained. By performing the annealing of the wafer under the oxidizing atmosphere at a temperature satisfying the above-described formula (1), it is possible to form a silicon oxide layer on a surface of the silicon wafer. Being accompanied with the formation of the silicon oxide layer, interstitial silicons are implanted to the interiors of COPs occurring within the silicon wafer, thereby completely filling the COPs, and as a result, eliminate the COPs.

In silicon wafers obtained by the above-described method, COP defects are scarcely exist in an interior of each wafer. In addition, variation of resistivity is reduced within a surface of a silicon wafer, and among the different wafers sliced from the same ingot. In the production process of an IGBT, generation of BMDs (bulk micro defects) and fluctuation of resistivity are scarcely caused. Therefore, it is possible to use a wafer of the invention as a suitable substrate for an insulated gate bipolar transistor (IGBT).

In addition, since a polysilicon layer or a strained layer is formed on a surface of the wafer as a gettering layer, heavy metals contaminating the wafer can be sufficiently removed.

In the above described method for producing a silicon wafer, by doping nitrogen in a silicon ingot, it is possible to remarkably reduce sizes of COPs in the infot. By annealing the silicon ingot under the above-described conditions of heat treatment, it is possible to completely eliminate the COPs. In addition, by the doping of nitrogen in the silicon crystal, it is also possible to inhibit the generation of slip dislocations.

In the above-described method for producing a silicon wafer, by polishing the wafer after the annealing of the wafer under the oxidizing atmosphere, it is possible to remove COPs remaining in the vicinity of the wafer surface after the annealing of the wafer under the oxidizing atmosphere. By removal of COPs in the vicinity of the wafer surface, it is possible to enhance the reliability of the gate oxide film.

A silicon wafer of the invention is a silicon wafer which is obtained by any one of the above-described methods for producing a silicon wafer.

A silicon wafer of the invention may be a silicon wafer which is sliced from a silicon ingot, the silicon wafer comprising:

a concentration of interstitial oxygen [Oi] of not more than $7 \times 10^{17}$ atoms/cm$^3$;

being doped with phosphorus;

a polysilicon layer or a strained layer formed on one side of the silicon wafer;

a density of COPs within the wafer of not more than $1 \times 10^5$/cm$^3$; and a density of crystal defects of not more than $5 \times 10^7$ /cm$^3$ after being subjected to a double-step heat treatment including a heat treatment of the wafer for 4 hours at 800° C., and a heat treatment of the wafer for 16 hours at 1000° C. It is preferable that density of COPs be not more than $4.4 \times 10^4$/cm$^3$. It is more preferable that density of COPs be not more than $1.0 \times 10^4$/cm$^3$.

In the above-described silicon wafer for an IGBT, it is preferable that the concentration of nitrogen be not less than $2 \times 10^{13}$ atoms/cm$^3$ and not more than $5 \times 10^{15}$ atoms/cm$^3$.

In the above-described silicon wafer for an IGBT, it is preferable that the concentration of phosphorus in the wafer be not less than $4.3 \times 10^{13}$ atoms/cm$^3$ and not more than $2.2 \times 10^4$ atoms/cm$^3$. Preferably, a resistivity of the silicon wafer is about 20 Ω·cm to 100 Ω·cm The above-described silicon wafer has been produced by any one of the above-described methods for producing a silicon wafer. Therefore, COP defects scarcely exist in the interior of the wafer, and variation of resistivity is reduced within the surface of a silicon wafer, and among different wafers sliced from the same ingot. In addition, in the silicon wafer, generations of BMDs and oxygen donors are scarcely caused during a production process of an IGBT. Therefore, insulation breakdown caused by COPs, deterioration of recombination lifetime caused by generation of BMDs, and fluctuation of resistivity caused by oxygen donors do not occur in the silicon wafer. Therefore, the wafer of the invention can be suitably applied as a substrate of an insulated gate bipolar transistor (IGBT).

In addition, the above-described silicon wafer is a phosphorus-doped wafer of high resistivity, the wafer is suitably applied as a substrate of an IGBT. In addition, since one side of the surface of the silicon wafer is provided with a polysilicon layer or a strained layer as a gettering layer, it is possible to remove contamination of heavy metals during the production process of the IGBT.

In addition, the above-described silicon wafer is obtained from a crystal having a concentration of nitrogen of not less than $2\times10^{13}$ atoms/cm$^3$ and not more than $5\times10^{15}$ atoms/cm$^3$, and small sized COPs. Therefore, COPs are almost completely eliminated in the wafer, and the wafer can be suitably used as a substrate for an IGBT. In addition, by doping of nitrogen, generation of slip dislocations can be inhibited, and the quality of the wafer can be enhanced.

In addition, the production process of an IGBT includes various heating steps by which a silicon wafer for the IGBT is unavoidably heated. In the silicon wafer of the invention, even after being influenced by various thermal histories corresponding to the heating steps in the production process of an IGBT, resistivity is not changed and the recombination lifetime is not reduced in the silicon wafer. Therefore, the wafer can be suitably used as a substrate of various devices exemplified by an IGBT.

As explained above, in the method for producing a silicon wafer of the invention, by annealing a CZ silicon ingot having an extremely low concentration of interstitial oxygen under an oxidizing atmosphere, it is possible to eliminate COPs in the wafer. In addition by transforming a predetermined amount of the silicon atoms into phosphorus atoms by irradiating neutrons to the silicon ingot, it is possible to obtain a silicon wafer having a constant resistivity.

A silicon wafer obtained by the above-described method scarcely includes COPs, and has a constant resistivity. Therefore, the wafer of the invention can be suitably used as a substrate of an insulated gate bipolar transistor (IGBT).

BRIEF DESCRIPTION OF THE DRAWINGS

FIG. 2A and FIG. 2B are photographs taken by X-ray topography of silicon wafers according to example 1.

FIGS. 3A to 3D are photographs taken by x-ray topography of silicon wafers according to Example 2 and Example 3.

DETAILED DESCRIPTION OF THE INVENTION

Figure 1:
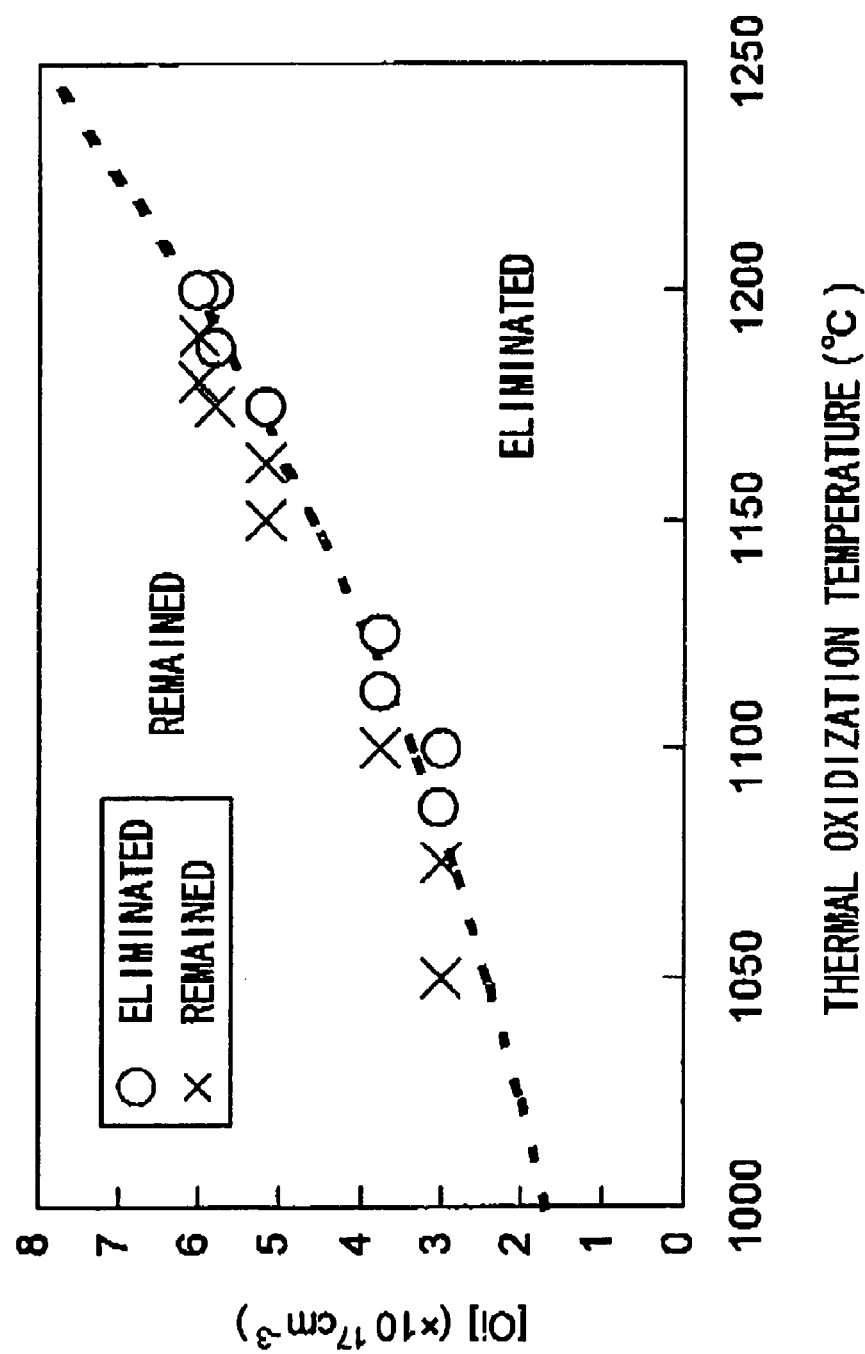
FIG. 1 is a graph showing a relationship between the concentration of interstitial oxygen in a wafer, annealing temperature, and a successiveness in extinction of COPs in the wafer.

As an embodiment of the invention, a method for producing a silicon wafer is explained in the following.

A method for producing a silicon wafer of the invention comprises the following steps. A silicon ingot is grown by the Czochralski method (CZ method) to have an interstitial oxygen concentration [Oi] of not more than $7.0\times10^{17}$ atoms/cm$^3$. Next, after doping phosphorus in the silicon ingot by irradiating a neutron beam to the ingot, wafers are sliced from the ingot. Next, each wafer is annealed in an oxidizing atmosphere containing at least oxygen at a temperature of T(° C.) that satisfies a formula, $$[Oi] \leq 2.123\times10^{21} \exp(-1.035/k(T+273)) \qquad (1).$$

Then, a polysilicon layer or a strained layer is formed on one side of the wafer.

In the above-described formula (1), [Oi] is measured by Fourier transform infrared spectrometry based on ASTM F-121(1979); and k is Boltzman constant ($8.617\times10^{-5}$(eV/K)).

In the above-described method for producing a silicon wafer for an IGBT, during growth, it is preferable to form a silicon ingot having a nitrogen concentration of not less than $2\times10^{13}$ atoms/cm$^3$ and not more than $5\times10^{15}$ atoms/cm$^3$ by doping nitrogen during the growth of the silicon ingot.

The nitrogen concentration may be analyzed secondary ion mass spectrometry (SIMS). Using SIMS, it is difficult to measure a nitrogen concentration in an order of $1\times10^{13}$ atoms/cm$^3$. In such a case, the nitrogen concentration may be calculated from an amount of dopant doped in the formation process of an ingot and segregation coefficient of nitrogen.

In addition, in the method for producing a silicon wafer of the present embodiment, a strained layer may be formed on back side of the wafer by a sand blasting method or the like before annealing of the wafer under the oxidizing atmosphere.

Each step is explained in the following.

A silicon ingot having an interstitial oxygen concentration [Oi] of not more than $7.0\times10^{17}$ atoms/cm$^3$ may be produced by the Czochralski method (CZ method). Production of the silicon ingot by the CZ method is performed in the following manner. Firstly, a block of polycrystalline silicon is loaded in a quartz crucible of a pulling apparatus. A silicon melt is formed by heating the block of polycrystalline silicon in an argon (Ar) atmosphere. Next, a seed crystal is immersed in the silicon melt and is gradually pulled up while rotating the seed crystal and the crucible, thereby a single crystal is grown under the seed crystal. At that time, as an example of growth conditions, a ratio V/G of a growth rate V (mm/minute) of the crystal and thermal gradient G (° C./mm) between the melting point and 1350° C. may be controlled to be in an order of 0.22 to 0.27 during the growth of the crystal. As an example of additional conditions, it is possible to control the cycle of the quartz crucible to be 0.05 to 0.5 rpm, pressure of the Ar atmosphere to be 30 torr, and magnetic field strength to be 3500 Gauss. By controlling the interstitial oxygen concentration [Oi] of the silicon ingot to be not more than $7.0\times10^{17}$ atoms/cm$^3$, generation of oxygen donors during a production process of an IGBT can be inhibited. An interstitial oxygen concentration [Oi] exceeding $7.0\times10^{17}$ atoms/cm$^3$ is not preferable, because at such a concentration, oxygen donors are generated during the production process of the IGBT, and change the properties of the IGBT.

By doping nitrogen in the silicon ingot, sizes of COPs are reduced, and the COPs can be eliminated by annealing for a relatively short time period. In addition, by the nitrogen doping, it is possible to cause an effect of pinning a dislocation by nitrogen, and it is possible to inhibit the generation of slip dislocations during heat treatment at a high temperature. As a method for nitrogen doping, it is possible to apply any known method. For example, by melting a silicon wafer having a nitride film along with a polycrystalline silicon raw material, it is possible to grow a silicon ingot doped with nitrogen.

Next, the silicon ingot which has been produced by the above-described method is subjected to neutron beam irradiation. By the neutron beam irradiation, a predetermined amount of the silicon atoms are transformed to phosphorus atoms, thereby the silicon ingot is homogeneously doped with phosphorus and has homogeneous resistivity. The silicon ingot includes silicon 30($^{30}$Si) as an isotope of silicon. By neutron irradiation, $^{30}$Si may be converted to $^{31}$Si which transforms to stable isotope phosphorus 31 ($^{31}$P) by nuclear transformation. When an n type silicon single crystal is doped with phosphorus by a method of adding phosphorus to a silicon melt from which the silicon single crystal is pulled, the resistivity changes along a pulling direction of the ingot, and causes changes of the resistivity of the ingot. Therefore, in the invention, it is necessary to use a neutron irradiation method by which the concentration of dopant in the silicon ingot can be homogeneously distributed. For example, conditions for the neutron beam irradiation can be controlled such that at a position at which the flux of neutron beam is $3.0 \times 10^{12}$ neutrons/cm$^2$/s, an ingot is irradiated with the neutrons for 80 hours while being rotated at a cycle of 2 rpm.

Thus, after the neutron irradiation, a silicon ingot acquires a resistivity of 48 Ω·cm to 52 Ω·cm.

Next, wafers are sliced from the silicon ingot. Where necessary, each wafer is subjected to lapping, etching or the like. Subsequently, where necessary, a strained layer is formed on the silicon wafer by a sand blasting method or the like.

Next, the wafer is annealed in an oxidizing atmosphere. The atmosphere for the annealing is not limited provided that oxygen is contained in the atmosphere. For example, a mixed gas of oxygen and an other gas such as nitrogen or argon may be used. However, in order to shorten the time period which is required for eliminating COPs, it is preferable to use an oxygen atmosphere and a mixed atmosphere of oxygen and water vapor.

The annealing should be performed at a temperature T(° C.) which satisfies the formula, $$[Oi] \leq 2.123 \times 10^{21} \exp(-1.035/k(T+273)) \quad (1).$$

In the above-described formula (1), [Oi] is an interstitial oxygen concentration in the silicon wafer, measured by Fourier transform infrared spectrometry based on ASTM F-121(1979); and k is Boltzman constant ($8.617 \times 10^{-5}$(eV/K)). By annealing the wafer under conditions of formula (1), it is possible to eliminate COPs in the wafer almost completely. More specifically, where the interstitial oxygen concentration [Oi] is $7.0 \times 10^{17}$ atoms/cm$^3$, the annealing temperature should be not lower than 1230° C. and not higher than the melting point of silicon. At the same temperature, as COPs have large sizes, a long annealing time is required. Therefore, the time period for annealing cannot be fixed to a limited value. For example, in order to eliminate COPs of 0.17 μm in size by annealing at a temperature of 1150° C., an annealing time of 2 hours is required. By doping nitrogen at the time of pulling the crystal, COP sizes are reduced, and the time period for annealing can be shortened.

It is possible to use different atmospheres for the heating step and annealing step at an annealing temperature. For example, it is possible to use mixed gas atmosphere containing oxygen for heating a crystal up to an annealing temperature, and a pure oxygen atmosphere for annealing of the crystal at the annealing temperature.

Next, a polysilicon layer can be formed on one side of the wafer. Since the silicon wafer of the present embodiment has an extremely low oxygen concentration, it is impossible to expect a gettering effect by oxygen. Therefore, after the annealing of the wafer in an oxidizing atmosphere, one side of the wafer must be provided with a polysilicon layer as a getteing layer in order to remove the contamination with heavy metals caused during the production process of an IGBT. A thickness of the polysilicon layer may be not less than 0.5 μm and not more than 2 μm. A polysilicon layer of not less than 0.5 μm in thickness can exhibit a sufficient gettering effect. A thickness of not more than 2 μm is sufficient for inhibiting warpage of the wafer.

A silicon wafer produced by the above-described method comprises an interstitial oxygen concentration [Oi] of not more than $7 \times 10^{17}$ atoms/cm$^3$, and is doped with phosphorus, and is provided with a polysilicon layer or a strained layer on one side of the wafer. In addition, an internal portion of the wafer scarcely contains COPs. Preferably, the nitrogen concentration of the wafer is not less than $2 \times 10^{13}$ atoms/cm$^3$ and not more than $5 \times 10^{15}$ atoms/cm$^3$. More preferably, the phosphorus concentration in the wafer is not less than $4.3 \times 10^{13}$ atoms/cm$^3$ and not more than $2.2 \times 10^{14}$ atoms/cm$^3$, and the resistivity is about 20 Ω·cm to 100 Ω·cm. Such a silicon wafer can be suitably used as a substrate for an IGBT.

While the silicon wafer of the present embodiment is suitably used as a substrate for an IGBT, the production process of the IGBT includes various heating steps, by which the silicon wafer is unavoidably heated. In the silicon wafer of the present embodiment, even after being subjected to various thermal histories corresponding to the heating steps in the production process of an IGBT, the resistivity is not changed and the recombination lifetime is not reduced in the silicon wafer. Therefore, the wafer can be suitably used as a substrate of various devices exemplified by an IGBT. Specifically, even after being subjected to a double-step heat treatment including a heat treatment at 800° C. for 4 hours and heat treatment at 1000° C. for 16 hours, the percentage reduction of the recombination lifetime before and after the heat treatment is within the range of 20%. With a wafer having a resistivity of 50 Ω·cm, even after heat treatment of the wafer at a temperature of 450° C. for 1 hour, the reduction of the resistivity is controlled to be about 8%.

EXAMPLES

In the following, the present invention is explained in detail based on Examples. Example 1

Firstly, silicon ingots of various interstitial oxygen concentrations were produced by the CZ method. Specifically, each single crystalline silicon ingot was prepared by the following steps. Firstly, a block of polycrystalline silicon was loaded in a quartz crucible, and a silicon melt was formed by heating the block of polycrystalline silicon in an Ar atmosphere. Next, a seed crystal was immersed in the silicon melt and was gradually pulled up while rotating the seed crystal and the crucible, thereby a single crystal was grown under the seed crystal. At that time, as an example of growth conditions, a ratio V/G of a growth rate V (mm/minute) of the crystal and thermal gradient G (° C./mm) between the melting point and 1350° C. was controlled to be about 0.27. The interstitial silicon concentration was controlled by controlling rotation cycle of the quartz crucible and the pressure of the argon atmosphere. Interstitial oxygen concentration may be reduced by lowering the cycle of the quartz crucible, or by reducing a pressure of the argon atmosphere. In addition, by using a MCZ method (magnetic field applied Czochralski method), it is easy to produce a silicon ingot of low oxygen concentration. Thus, a plurality of silicon ingots having an interstitial oxygen concentration within a range of $3 \times 10^{17}$ atoms/cm$^3$ to $6 \times 10^{17}$ atoms/cm$^3$ were produced. Wafers were sliced from the ingots. After performing etching of the wafers in order to remove work strain, COP densities in the wafers were measured. Each wafer showed a COP density within a range of $3 \times 10^6$/cm$^3$ to $6 \times 10^6$/cm$^3$. In the measurement of the COP densities, an OPP (Optical Precipitate Profiler) of Accent Optical Technologies was used.

Next, silicon ingots which had been prepared under the same conditions as the above-described growth conditions were doped with phosphorus by neutron beam irradiation to the ingots. Each ingot was irradiated with a neutron beam having a flux of $3.0 \times 10^{12}$ neutrons/cm$^2$/s for 80 hours. After that, wafers were sliced from the silicon ingots. The sliced wafers were subjected to surface treatment including lapping and etching.

Next, the wafers were introduced in an annealing apparatus, and were subjected to heat treatment in an oxidizing atmosphere. The annealing temperature T (° C.) was controlled within a range of 1050° C. to 1200° C. The atmosphere for the annealing was controlled to be an oxygen atmosphere comprising 100% of oxygen. Thus, silicon wafers of 150 mm in diameter having various interstitial oxygen concentrations and being treated with various annealing temperatures were obtained.

COP densities in the wafers were measured by the OPP. In order to avoid the influence of surface irregularities of one side and the other side of a wafer, both sides of each wafer were polished before the OPP measurement, and the lower limit of the detection size was set at 30 nm. Where the density of defects was not more than $4.4 \times 10^4$/cm$^3$, it was considered that COPs had been eliminated.

The interstitial oxygen concentration was measured by the Fourier transform infrared spectrometry based on a standard of ASTM F-121(1979). The results are shown in FIG. 1. In FIG. 1 the vertical axis shows interstitial oxygen concentrations, and the horizontal axis shows annealing temperatures. Open circles indicate wafers in which COPs are regarded to have been eliminated, and crucial marks indicate wafers in which COPs are regarded to remain.

As shown in FIG. 1, where a dashed line shows boundary conditions, COPs remained in wafers having an oxygen concentration higher than the boundary, and COPs were eliminated in wafers having an oxygen concentration lower than the boundary. The following formula was obtained to approximate the boundary conditions, $$[Oi] = 2.123 \times 10^{21} \exp(-1.035/k(T+273)) \quad (2).$$

Therefore, it was determined that suitable conditions for the annealing temperature were expressed by the formula, $$[Oi] \leq 2.123 \times 10^{21} \exp(-1.035/k(T+273)) \quad (3).$$

Next, wafers in which COPs were regarded as having been eliminated were subjected to X-ray topography to examine presence of slip dislocations. In the examination for the presence of slip dislocations on wafers having an oxygen concentration of $5.5 \times 10^{17}$ atoms/cm$^3$ and being heat treated at 1200° C., as shown in FIG. 2A and FIG. 2B, it was confirmed that slip dislocations were not observed in the wafers.

Next, yields of gate oxide integrity (GOI) in the wafers were examined using the conditions of gate oxide thickness of 25 nm, electrode area of 8 mm$^2$, and criteria for electric field strength of 11 MV/cm. As a results, the yields of gate oxide integrity were 100%.

Example 2

Silicon ingots having various interstitial oxygen concentrations were produced by the CZ method. Those ingots were doped with nitrogen. Specifically, each single crystalline silicon ingot was prepared by the following steps. Firstly, a block of polycrystalline silicon was loaded in a quartz crucible, and a silicon melt was formed by heating the block of polycrystalline silicon in an Ar atmosphere. As a dopant of nitrogen, a silicon wafer having a nitride film was loaded to the silicon melt. Next, a seed crystal was immersed in the silicon melt and was gradually pulled up while rotating the seed crystal and the crucible, thereby a single crystal was grown under the seed crystal. At that time, the pulling rate of the crystal was controlled to be about 1.2 mm/minute. Thus, silicon ingots having an interstitial oxygen concentration of $3.5 \times 10^{17}$ atoms/cm$^3$ and nitrogen concentration of $2.5 \times 10^{14}$ atoms/cm$^3$ were produced.

COP density of the silicon ingots was measured to be $2.0 \times 10^7$/cm$^3$.

Next, in a same manner as Example 1, the silicon ingots were doped with phosphorus by neutron beam irradiation. After that, wafers were sliced from the ingots. The sliced wafers were subjected to surface treatments including lapping and etching or the like.

Next, the wafers were introduced in an annealing apparatus, and were subjected to annealing in an oxidizing atmosphere. The annealing condition was controlled to comprise heating up to 1100° C. at a heating rate of 5° C./minute, and heating up to 1050° C. at a heating rate of 1° C./minute, and annealing the wafers for 3.5 hours at an annealing temperature of 1150° C., and cooling to 900° C. at a cooling rate of 2° C./minute. In the above-described conditions, the annealing temperature satisfied the above described formula (3). During the heating the atmosphere was controlled to be a nitrogen atmosphere containing 3% of oxygen by volume. After reaching the annealing temperature, the atmosphere was changed to an oxygen atmosphere comprising 100% of oxygen. The time period between inserting the wafers into the furnace and extracting the wafers from the furnace was controlled to be 14 hours. Thus, silicon wafers of Example 2 of 200 mm in diameter were obtained.

Example 3

Silicon wafers of Example 3 of 200 mm in diameter were prepared by the same manner as Example 2 except that a silicon melt was not loaded with a silicon wafer having a nitride film. The silicon wafers of Example 3 had the same interstitial oxygen. concentration as that of the silicon wafers of Example 2.

Evaluation of Example 2 and Example 3

COP densities of silicon wafers of Example 2 and Example 3 were measured by the same method and under the same conditions as those of Example 1. COP densities of the wafers of Example 2 and Example 3 were not more than $4.4 \times 10^4$/cm$^3$. Therefore, it was confirmed that COPs were eliminated by the annealing in an oxidizing atmosphere.

Next, the occurrence of slip dislocations in wafers of Example 2 and Example 3 were examined by X-ray topography. FIGS. 3A to 3D show images of X-ray topography. As shown in FIGS. 3A to 3D, a slip dislocation was generated in lower right of the wafer of each example. In the nitrogen-doped wafers of Example 2, the length of the slip dislocation was within a range of 0.3 to 0.8 cm. While wafers of Example 3 not doped with nitrogen showed a slip length within a range of 0.8 to 1.5 cm. That is, slip lengths in wafers of Example 3 were slightly longer than those of Example 2. Compared to Example 3, shortening of slip length in wafers of Example 2 was considered to be an effect of nitrogen-doping.

Next, yields of gate oxide integrity (GOI) in the wafers were examined using conditions of a gate oxide thickness of 25 nm, electrode area of 8 mm$^2$, and criteria for electric field strength of 11 MV/cm. As a results, the yields of gate oxide integrity were not less than 95%.

Figure 4A:
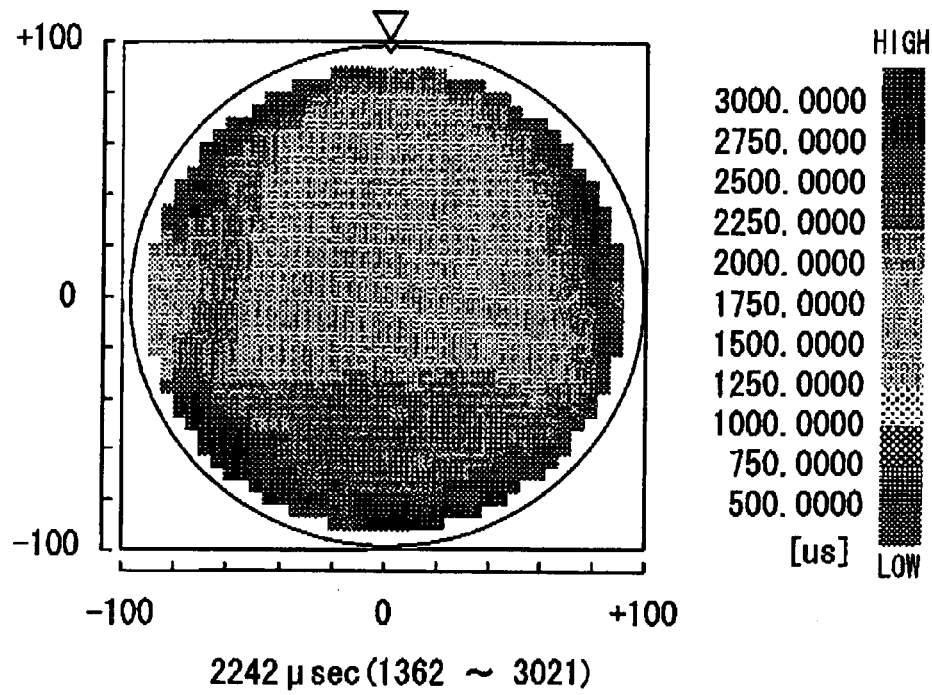
FIG. 4A and FIG. 4B are distribution maps indicating the distribution of the recombination lifetime in a wafer before and after heat treatment of the wafer according to Example 2.
Figure 4B:
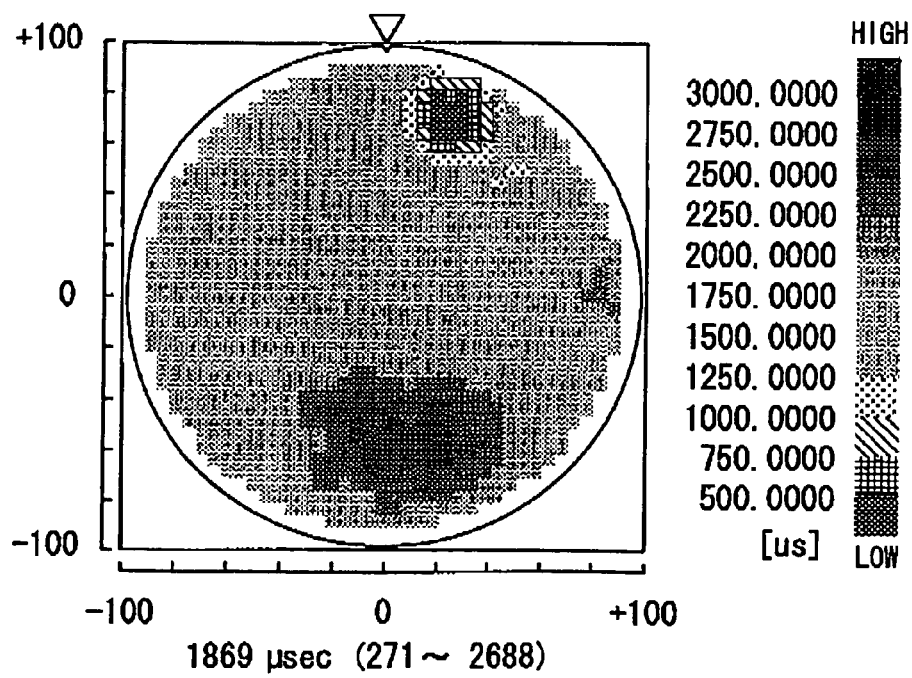
Figure 5A:
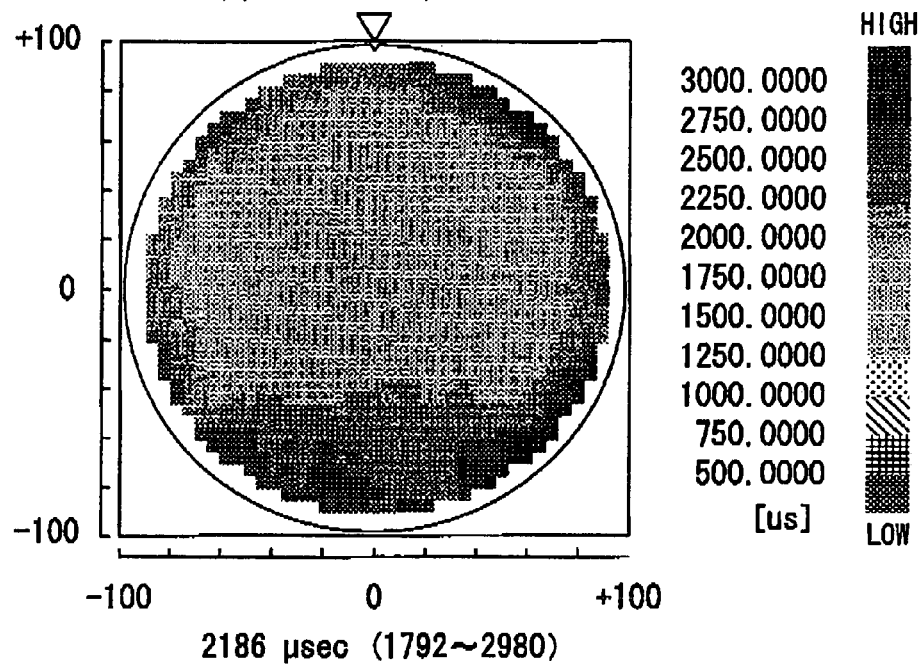
FIG. 5A and FIG. 5B are distribution maps indicating the distribution of the recombination lifetime in a wafer before and after heat treatment of the wafer according to Example 3.
Figure 5B:
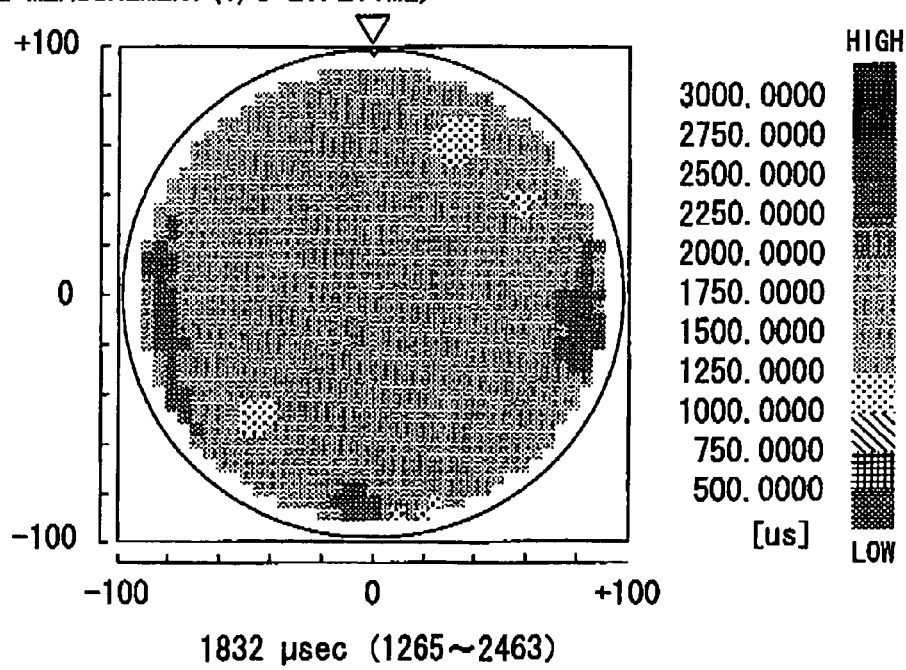

Next, the recombination lifetime in wafers of Example 2 and Example 3 was measured. In the measurement of recombination lifetime, wafers of example 2 and Example 3, and wafers obtained by performing predetermined heat treatment on the wafers of Example 2 and Example 3 were subjected to the measurement. The measurement of recombination lifetime was performed by a μ-PCD method. In addition, as the heat treatment conditions, heat treatment conditions analogous to those for a production process of an IGBT, in which the lowest temperature was 350° C. and highest temperature was 1150° C., were used. FIG. 4A and FIG. 4B show a distribution of the recombination lifetime in a silicon wafer of Example 2 before and after the heat treatment. FIG. 5A and FIG. 5B show a distribution of the recombination lifetime in a silicon wafer of Example 3 before and after the heat treatment. Distribution ranges of the recombination lifetime and average value of the recombination lifetime in wafers of Example 2 and Example 3 are listed in Table 1.

TABLE 1

|  | Heat treatment | Recombination lifetime (μsec) | |
|---|---|---|---|
|  |  | Average value | Distribution range |
| Example 2 nitrogen-doped | Before heat treatment | 2242 | 1362 to 3021 |
|  | After heat treatment | 1869 | 271 to 2688 |
| Example 3 not doped with nitrogen | Before heat treatment | 2186 | 1792 to 2980 |
|  | After heat treatment | 1832 | 1265 to 2463 |

As shown in FIG. 4A, FIG. 4B, FIG. 5A, FIG. 5B and Table 1, the recombination lifetime is slightly shortened by the heat treatment. The level of the recombination lifetime is a sufficient value as a substrate of an IGBT.

Before formation of an IGBT, a wafer is subjected to various heat treatments. The above-described conditions for heat treatment were determined in order to simulate the thermal history, to which a wafer was subjected before the production of the IGBT. A wafer treated with the above-described heat treatment can be considered as a wafer subjected to the same thermal history as an IGBT.

As described above, even after being worked to an IGBT, wafers of Example 2 and Example 3 had a sufficient recombination lifetime. Therefore, those wafers were suitable as substrates of devices such as an IGBT or the like.

Figure 6B:
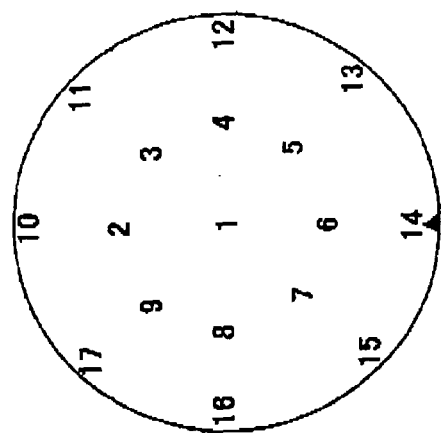
FIG. 6A and FIG. 6B are distribution maps indicating the distribution of the resistivity in wafers according to Example 2.
Figure 6A:
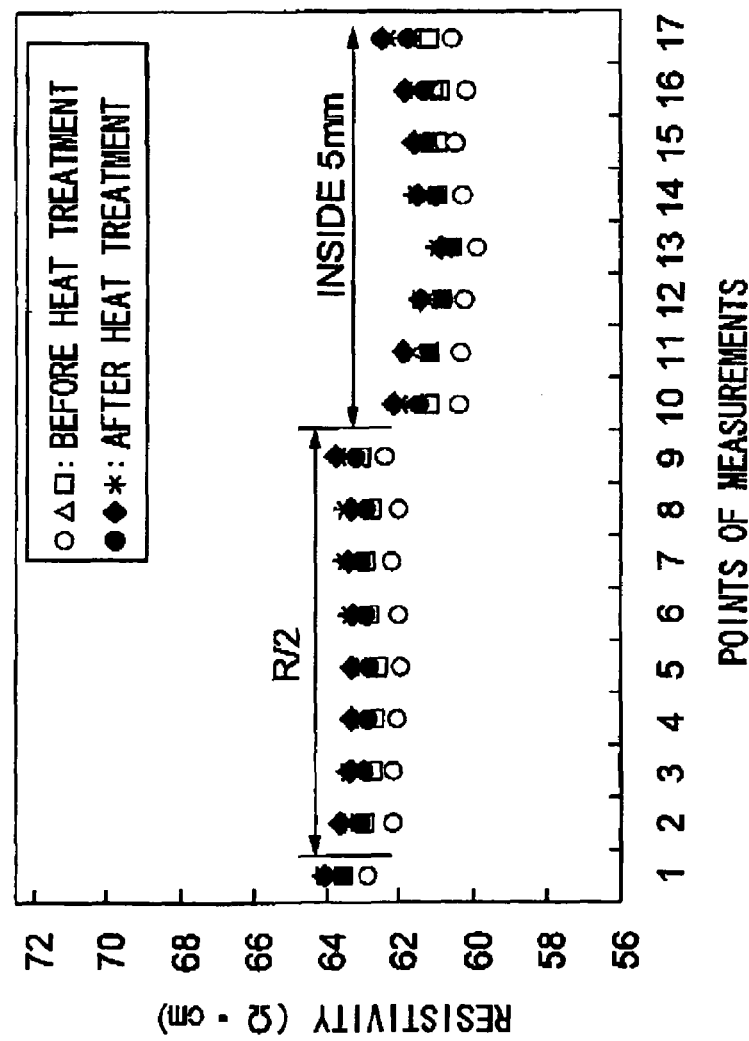
Figure 7B:
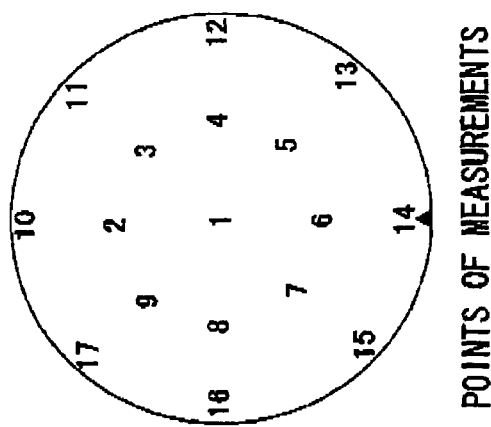
FIG. 7A and FIG. 7B are distribution maps indicating the distribution of the resistivity in wafers according to Example 3.
Figure 7A:
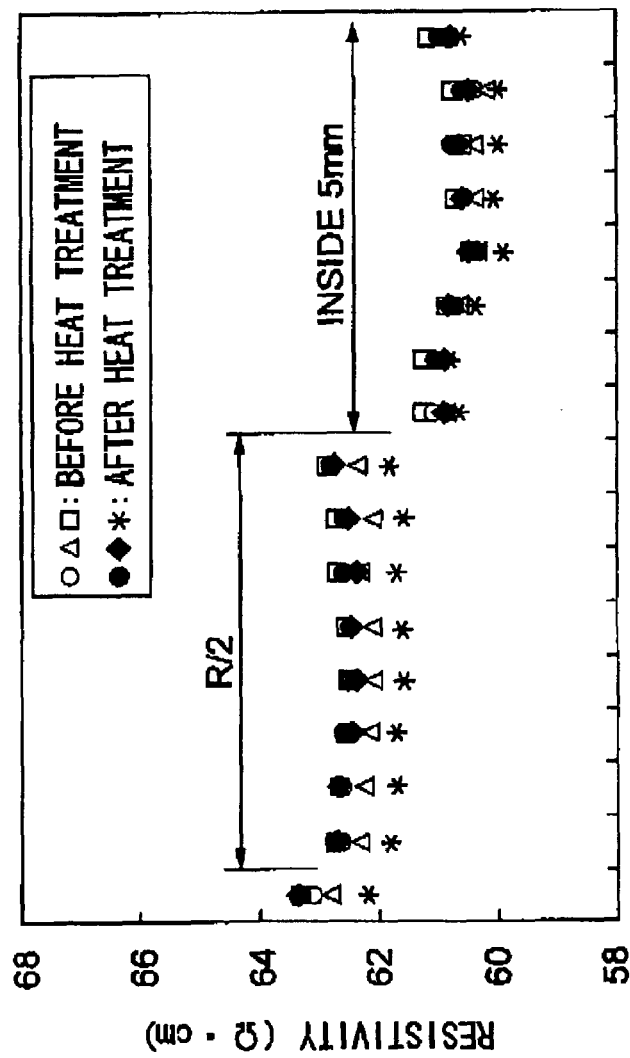

Next, the resistivity of the wafers of Example 2 and Example 3 was measured before and after the heat treatment of the wafer. The results for Example 2 are shown in FIG. 6A and FIG. 6B. The results for Example 3 are shown in FIG. 7A and FIG. 7B. FIG. 6A and FIG. 6B indicate a relationship between resistivity and points of measurement. FIG. 6B and FIG. 7B indicate points of measurement on each wafer. In each wafer, measurements of the resistivity were performed at 17 points comprising a center point (1), eight points (2 to 9) aligned on a virtual circle having a radius of ½ of a wafer radius, and eight points (10 to 17) on a virtual circle having a radius which is smaller than the wafer radius by 5 mm.

As it is shown in FIG. 6A, FIG. 6B, FIG. 7A, FIG. 7B, the resistivity of the wafers scarcely changed before and after the heat treatment. In addition, it was also confirmed that nitrogen-doped wafers of Example 2 and wafers of Example 3 not doped with nitrogen showed hardly any difference in resistivity. Those results indicated that the generation of thermal donors and N—O donors (complex of nitrogen and oxygen) was inhibited because of a sufficiently low oxygen concentration in the crystal. Comparing the resistivity from the center point (1), eight points (2 to 9) on the circle having a radius of ½ of a wafer radius, and eight points (10 to 17) on a peripheral portion of the wafer, variations in a range of 2 to 3 Ω·cm were observed in resistivity. Considering that the resistivity of the wafer is in a range of 60 to 64 Ω·cm, the variation is not a sufficient level to cause problems on quality of the wafer. Therefore, the wafers were suitable as substrate of an IGBT.

Example 4

By controlling the cycle of a quartz crucible and a pressure of argon atmosphere, 4 silicon ingots respectively having an oxygen concentration of 5.6×10$^{17}$ atoms/cm$^3$ (sample No. 1), 7.0×10$^{17}$ atoms/cm$^3$ (sample No. 2), 8.1×10$^{17}$ atoms/cm$^3$ (sample No. 3), 9.5×10$^{17}$ atoms/cm$^3$ (sample No. 4) were pulled. Each ingot was doped with nitrogen of 3×10$^{14}$ atoms/cm$^3$. By neutron irradiation on the ingots, each ingot acquired a resistivity of 50 Ω·cm. Wafers having a diameter of 150 mm were sliced from those ingots. The wafers were subjected to annealing in an oxygen atmosphere comprising 100% of oxygen for 1 hour at 1200° C. After the annealing, the surface of the wafer was mirror polished. Thus, sample wafers of No. 1 to No. 4 were prepared.

Under the same conditions as Example 1, evaluation of the yield of gate oxide integrity (GOI) was performed on each wafer. In addition, each wafer was subjected to a double-step heat treatment including a heat treatment at 800° C. for 4 hours and a heat treatment at 1000° C. for 16 hours. The crystal defect density after the heat treatment, and change of the recombination lifetime before and after the heat treatment were examined for each wafer. In addition, each sample wafer was subjected to a heat treatment at 450° C. for 1 hour, and change in the resistivity before and after the heat treatment was examined. The double-step heat treatment comprising a heat treatment at 800° C. for 4 hours and a heat treatment at 1000° C. for 16 hours is a typical heat treatment which is embodied to evaluate an oxide precipitation property of a wafer. The heat treatment at 450° C. for 1 hour is a heat treatment for simulating a sintering treatment of aluminum circuits, performed in a latter stage of the production process of an IGBT. Allowance of resistivity in a substrate for the IGBT is typically in a range of ±8%, and the target value of resistivity in the present embodiment was 50 Ω·cm. Therefore, the allowable range of resistivity was in a range of 46 to 54 Ω·cm. The results of evaluation are shown in Table 2.

TABLE 2

| | Sample No. | | | |
|---|---|---|---|---|
| | No. 1 | No. 2 | No. 3 | No. 4 |
| [Oi] (atoms/cm$^3$) | $5.6 \times 10^{17}$ | $7.0 \times 10^{17}$ | $8.1 \times 10^{17}$ | $9.5 \times 10^{17}$ |
| GOI yield (%) | 99.1 | 27.0 | 26.6 | 24.9 |
| Density of crystal defects (/cm$^3$) | not more than $4.4 \times 10^4$ | $5.0 \times 10^7$ | $2.2 \times 10^8$ | $7.2 \times 10^8$ |
| Recombination lifetime (μsec) Before heat treatment | 2095 | 1986 | 2024 | 1956 |
| Recombination lifetime (μsec) After heat treatment | 2056 | 1932 | 97 | 56 |
| Resistivity (Ω·cm) Before heat treatment | 50.1 | 50.2 | 49.9 | 50.3 |
| Resistivity (Ω·cm) After heat treatment | 48.0 | 46.4 | 25.8 | 23.8 |

Regarding the yield of GOI, sample wafer No. 1 shows a yield of nearly 100% since only in sample wafer No. 1 did the oxygen concentration satisfy the conditions of the formula (1) at the annealing temperature of 1200° C. In order to eliminate COPs of respective sample wafers of No. 2, No. 3, and No. 4, annealing of the wafer at a temperature of not lower than 1226° C., not lower than 1253° C., and not lower than 1285° C. was required respectively.

Next, crystal defect densities measured by OPP and the recombination lifetime after a double-step heat treatment were measured for each wafer at 800° C. for 4 hours and at 1000° C. for 16 hours. In sample No. 1, crystal defects were not detected, since COPs were eliminated by oxygen annealing, and oxide precipitates (BMDs) were not generated by the double-step heat treatment. Since BMDs did not occur in sample wafer No. 1, the recombination lifetime was not reduced in the sample wafer No. 1. In sample No. 2, defects of $5.0 \times 10^{17}$/cm$^3$ were detected. Judging from the density of the defects, most of the defects which were detected were considered to be COPs. Therefore, the recombination lifetime was hardly reduced in sample No. 2.

In samples No. 3 and No. 4, reduction of the recombination lifetime occurred because of the generation of BMDs during the double-step heat treatment.

Regarding the resistivity, the resistivity of the sample wafer decreases in an order of No. 1, No. 2, No. 3 and No. 4, since the concentration of oxygen donors generated by the heat treatment at 450° C. increases with increasing oxygen concentration in the wafer. Therefore, sample wafers of No. 1 and No. 2 were outside the allowable range of 50 Ω·cm±8% (46 to 54 Ω·cm).

By raising the annealing temperature, COPs could be eliminated. However, in order to inhibit the reduction of recombination lifetime caused by the generation of BMDs, and to inhibit the reduction of the resistivity, it is necessary to control the oxygen concentration of the wafer to be not more than $7 \times 10^{17}$ atoms/cm$^3$.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A silicon wafer for an IGBT, which is sliced from a silicon ingot produced by the Czocralski method, the silicon wafer comprising:
   a concentration of interstitial oxygen [Oi] of not more than $7 \times 10^{17}$ atoms/cm$^3$;
   being doped with phosphorus;
   a polysilicon layer or a strained layer formed on one side of the silicon wafer;
   a density of COPs within the wafer of not more than $4.4 \times 10^4$/cm$^3$; and
   a density of crystal defects of not more than $5 \times 10^7$/cm$^3$ after being subjected to a double-step heat treatment including a heat treatment of the wafer for 4 hours at 800° C., and a heat treatment of the wafer for 16 hours at 1000° C.

2. A silicon wafer for an IGBT according to claim 1, wherein a concentration of nitrogen in the wafer is not less than $2 \times 10^{13}$ atoms/cm3 and not more than $5 \times 10^{\,}$ atoms/cm$^3$.

* * * * *